(12) United States Patent
Seo et al.

(10) Patent No.: US 11,910,646 B2
(45) Date of Patent: Feb. 20, 2024

(54) DISPLAY APPARATUS HAVING DISCHARGE ELEMENT

(71) Applicant: Samsung Display Co., Ltd., Yongin-si (KR)

(72) Inventors: Ilhun Seo, Yongin-si (KR); Daewoo Lee, Yongin-si (KR); Woosik Jun, Yongin-si (KR); Yunmo Chung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 49 days.

(21) Appl. No.: 17/025,740

(22) Filed: Sep. 18, 2020

(65) Prior Publication Data

US 2021/0343815 A1 Nov. 4, 2021

(30) Foreign Application Priority Data

Apr. 29, 2020 (KR) ........................ 10-2020-0052897

(51) Int. Cl.
*H10K 59/121* (2023.01)
*H10K 59/123* (2023.01)
*H10K 59/124* (2023.01)

(52) U.S. Cl.
CPC ....... *H10K 59/1213* (2023.02); *H10K 59/123* (2023.02); *H10K 59/124* (2023.02)

(58) Field of Classification Search
CPC ............. H01L 27/3262; H01L 27/3248; H01L 27/3258
USPC ........................................................... 257/40
See application file for complete search history.

(56) References Cited

U.S. PATENT DOCUMENTS

| 6,587,160 | B2 | 7/2003 | Lee et al. | |
| 8,102,489 | B2 | 1/2012 | Kim | |
| 9,000,428 | B2 | 4/2015 | Lee et al. | |
| 9,207,509 | B2 | 12/2015 | Shin et al. | |
| 2017/0077192 | A1* | 3/2017 | Jang | H01L 27/3244 |
| 2019/0067409 | A1* | 2/2019 | Shin | H01L 27/3258 |

(Continued)

FOREIGN PATENT DOCUMENTS

| KR | 10-0206565 B1 | 7/1999 |
| KR | 10-0299686 B1 | 10/2001 |
| KR | 10-0945354 B1 | 3/2010 |

(Continued)

OTHER PUBLICATIONS

US 10,636,860 B2, 04/2020, Shin et al. (withdrawn)

*Primary Examiner* — Xia L Cross
(74) *Attorney, Agent, or Firm* — Lewis Roca Rothgerber Christie LLP

(57) ABSTRACT

A display apparatus includes: a lower substrate including a display area and a non-display area; a thin film transistor at the display area; a display element at the display area and electrically connected to the thin film transistor; and a discharge element at the non-display area. The discharge element includes at least one electrode layer, at least one discharge layer on the electrode layer, and at least one first insulating layer between the electrode layer and the discharge layer, and a distance from an upper surface of the lower substrate to an upper surface of the discharge layer is greater than or equal to a distance from the upper surface of the lower substrate to an upper surface of a top layer of the thin film transistor.

20 Claims, 9 Drawing Sheets

(56) References Cited

U.S. PATENT DOCUMENTS

2020/0091252 A1* 3/2020 Bang .................. G06F 3/04164
2021/0359077 A1* 11/2021 Ko ..................... H01L 27/1248

FOREIGN PATENT DOCUMENTS

| KR | 10-2014-0133053 A | 11/2014 |
| KR | 10-2015-0026033 A | 3/2015 |
| KR | 10-2019-0024119 A | 3/2019 |

* cited by examiner

DISPLAY APPARATUS HAVING DISCHARGE ELEMENT

CROSS-REFERENCE TO RELATED APPLICATION

This application claims priority to and the benefit of Korean Patent Application No. 10-2020-0052897, filed on Apr. 29, 2020, in the Korean Intellectual Property Office, the entire disclosure of which is incorporated by reference herein.

BACKGROUND

1. Field

Aspects of one or more example embodiments relate to display apparatuses, and more particularly, to display apparatuses having an electrostatic discharge function.

2. Description of Related Art

As information society develops, demand for display apparatuses to display images is increasing in various forms. Furthermore, the thickness and weight of a display apparatus have been decreased, and thus, a range of use thereof is expanding.

Recently, flat display panels, which facilitate displaying of large-screen images, and manufacturing of flat panels with reduced weight and volume when compared to cathode ray tubes (CRTs), have been developed. Further, display apparatuses with reduced thickness and weight and having multiple functions have been designed. Accordingly, electrostatic sensitivity of circuit materials such as system integrated circuit (IC) chips is increasing.

The above information disclosed in this Background section is for enhancement of understanding of the background of the present disclosure, and therefore, it may contain information that does not constitute prior art.

SUMMARY

In comparative display apparatuses, static electricity, which may be generated during the manufacture and/or use of the display apparatuses, may flow into a display area and may damage display elements or circuits, thereby causing defects.

One or more example embodiments are directed to display apparatuses having an electrostatic discharge function. However, the present disclosure is not limited thereto, and additional aspects and features will be set forth in part in the description which follows and, in part, will be apparent from the description, or may be learned by practicing one or more example embodiments of the present disclosure.

According to one or more example embodiments of the present disclosure, a display apparatus includes: a lower substrate including a display area and a non-display area; a thin film transistor at the display area; a display element at the display area and electrically connected to the thin film transistor; and a discharge element at the non-display area. The discharge element includes at least one electrode layer, at least one discharge layer on the electrode layer, and at least one first insulating layer between the electrode layer and the discharge layer, and a distance from an upper surface of the lower substrate to an upper surface of the discharge layer is greater than or equal to a distance from the upper surface of the lower substrate to an upper surface of a top layer of the thin film transistor.

In an embodiment, the display element may include a pixel electrode, a counter electrode, and an intermediate layer between the pixel electrode and the counter electrode, the intermediate layer including an emission layer.

In an embodiment, the discharge layer may include a same material as that of the pixel electrode.

In an embodiment, the discharge layer may have a same layered structure as that of the pixel electrode.

In an embodiment, a direction from an edge of the lower substrate to a center of the lower substrate may be a first direction, and a width in the first direction of the upper surface of the discharge layer may be less than or equal to a width in the first direction of an upper surface of the pixel electrode.

In an embodiment, the first insulating layer may include a same material as that of a layer below the pixel electrode in contact with the pixel electrode.

In an embodiment, the first insulating layer may have a same layered structure as that of the layer below the pixel electrode in contact with the pixel electrode.

In an embodiment, the discharge element may further include a second insulating layer between the first insulating layer and the discharge layer.

In an embodiment, the discharge element may include: a first electrode layer, a first discharge layer above the first electrode layer, and a first-first insulating layer between the first electrode layer and the first discharge layer; and a second electrode layer, a second discharge layer above the second electrode layer, and a first-second insulating layer between the second electrode layer and the second discharge layer.

In an embodiment, the display apparatus may further include a metal layer on the lower substrate, and electrically connecting the first electrode layer and the second electrode layer to each other.

In an embodiment, the first electrode layer and the second electrode layer may be integrally formed.

In an embodiment, the first-first insulating layer and the first-second insulating layer may be integrally formed.

In an embodiment, the display apparatus may further include: an upper substrate; and a sealing member at the non-display area of the lower substrate, and between the upper substrate and the lower substrate, the sealing member surrounding the display area. The first discharge layer may be located outside a periphery of the sealing member, and the second discharge layer may be located within an internal boundary defined by the sealing member.

In an embodiment, the electrode layer may extend along at least part of an edge of the display area.

In an embodiment, the discharge layer may include a first discharge layer and a second discharge layer spaced from each other in a direction in which the electrode layer extends.

In an embodiment, the discharge layer may include a plurality of isolated-shape conductive layers spaced from each other in a direction in which the electrode layer extends.

According to one or more example embodiments of the present disclosure, a display apparatus includes: a lower substrate including a display area and a non-display area; a pixel circuit at the display area or the non-display area, and including a top conductive layer; a display element at the display area and electrically connected to the pixel circuit; and a discharge element at the non-display area. The discharge element includes at least one electrode layer, at least one discharge layer above the electrode layer, and at least one first insulating layer between the electrode layer and the discharge layer, and a distance from an upper surface of the lower substrate to an upper surface of the discharge layer is greater than or equal to a distance from the upper surface of the lower substrate to an upper surface of the top conductive layer of the pixel circuit.

In an embodiment, a direction from an edge of the lower substrate to a center of the lower substrate may be a first direction, and a width in the first direction of the upper surface of the discharge layer may be less than or equal to a width in the first direction of the upper surface of the top conductive layer of the pixel circuit.

In an embodiment, the discharge element may include: a first electrode layer, a first discharge layer above the first electrode layer, and a first-first insulating layer between the first electrode layer and the first discharge layer; and a second electrode layer, a second discharge layer above the second electrode layer, and a first-second insulating layer between the second electrode layer and the second discharge layer.

In an embodiment, the display apparatus may further include a metal layer on the lower substrate and electrically connecting the first electrode layer and the second electrode layer to each other.

BRIEF DESCRIPTION OF THE DRAWINGS

The above and other aspects and features of the present disclosure will be more clearly understood from the following detailed description of the illustrative, non-limiting example embodiments with reference to the accompanying drawings, in which.

DETAILED DESCRIPTION

Figure 1:
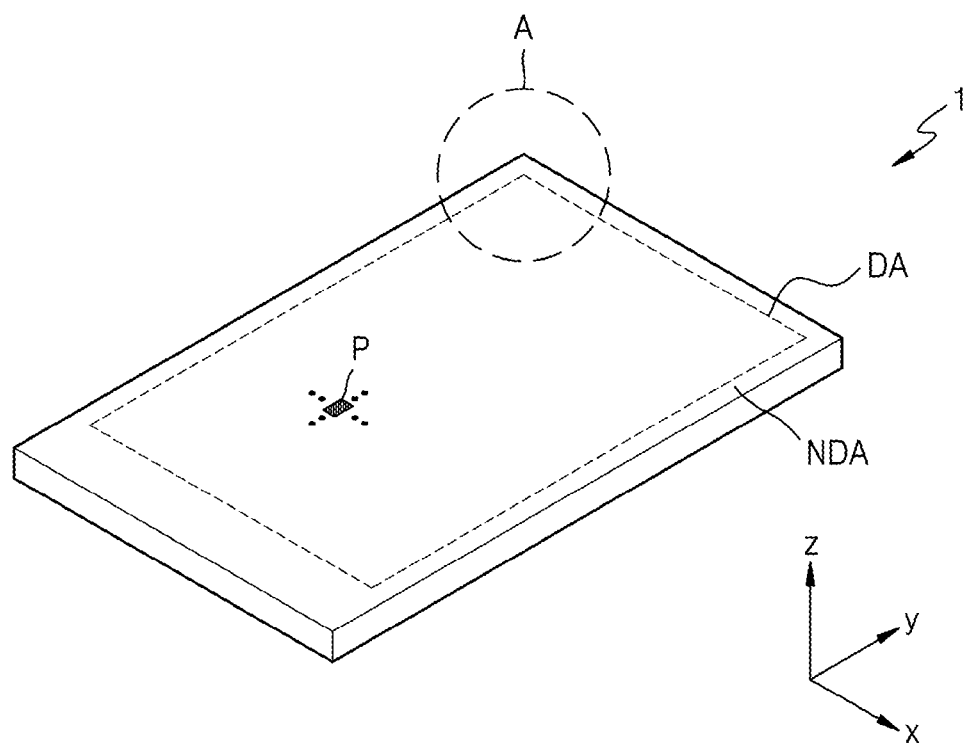
FIG. 1 is a schematic perspective view of a part of a display apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Further, the x-axis, the y-axis, and the z-axis shown in the figures are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. For example, the expression "at least one of a, b or c" indicates only a, only b, only c, both a and b, both a and c, both b and c, all of a, b, and c, or variations thereof.

As used herein, expressions such as "A or B," "at least one of A and/or B," or "at least one or more of A and/or B" may include all available combinations of the items listed together. For example, the expressions such as "A or B," "at least one of A and B," or "at least one of A or B" may signify all cases of (1) including at least one A, (2) including at least one B, or (3) including both of at least one A and at least one B.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a part of a display apparatus 1 according to an embodiment.

Referring to FIG. 1, the display apparatus 1 may include a display area DA at (e.g., in or on) which light is emitted, and a non-display area NDA at (e.g., in or on) which no light is emitted. For example, a lower substrate 100 (e.g., see FIG. 2) of the display apparatus 1 may be provided with the display area DA and the non-display area NDA. In some embodiments, the non-display area NDA may surround (e.g., around a periphery of) the display area DA, but the present disclosure is not limited thereto.

Although FIG. 1 illustrates that the display apparatus 1 includes the display area DA having a rectangular shape, the present disclosure is not limited thereto, and the display area DA may have any suitable shape, for example, such as a circle, an oval, a polygon, and/or the like.

The display apparatus 1 may provide an image through the display area DA. The display apparatus 1 may include a liquid crystal display apparatus, an electrophoretic display apparatus, an organic light-emitting display apparatus, an inorganic light-emitting display apparatus, a quantum-dot light-emitting display apparatus, a field emission display apparatus, a surface-conduction electron-emitter display apparatus, a plasma display apparatus, a cathode ray tube display apparatus, and/or the like, but the present disclosure is not limited thereto.

Figure 2:
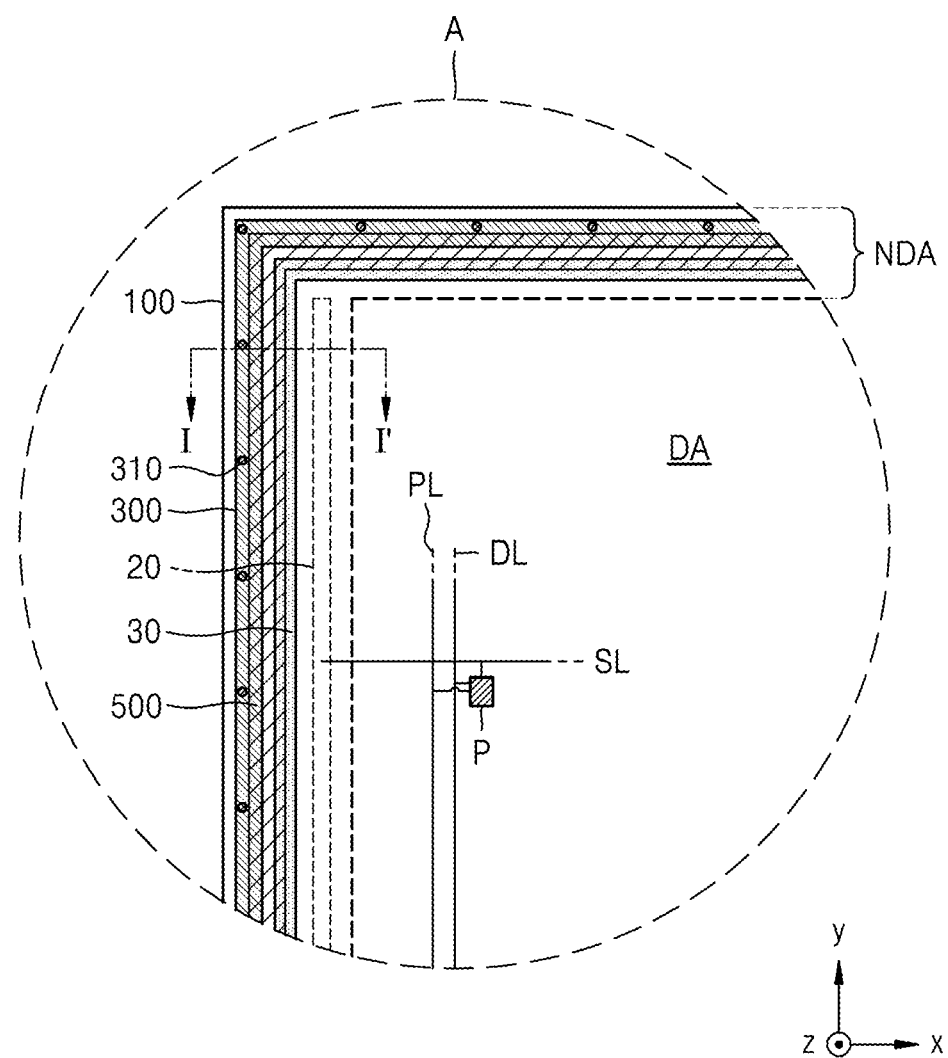
FIG. 2 is an enlarged schematic plan view of an example of the portion A of FIG. 1 according to an embodiment.

FIG. 2 is an enlarged schematic plan view of an example of the portion A of FIG. 1.

Referring to FIG. 2, the display apparatus 1 may include the display area DA and the non-display area NDA on the lower substrate 100.

In the display area DA, pixels P may be located at positions where a scan line SL extending in an x-axis direction and a data line DL extending in a y-axis direction cross (e.g., intersect) with each other. In this case, the pixels P may correspond to sub-pixels that emit light of different colors from each other. Each pixel P may include a display element 200, and may emit light of a red color, a green color, a blue color, or a white color. Each pixel P may include a pixel circuit connected to the scan line SL and the data line DL, and an organic light-emitting diode, for example, as the display element 200 connected to the pixel circuit.

The pixel circuit may include a thin film transistor, for example, a driving thin film transistor, a switching thin film transistor, and/or the like, and one or more capacitors, for example, a storage capacitor, and/or the like.

The switching thin film transistor is connected to the scan line SL and the data line DL, and may transmit, to the driving thin film transistor, a data signal input via the data line DL in response to a scan signal input via the scan line SL.

The storage capacitor is connected to the switching thin film transistor and a driving voltage supply line PL, and may store a voltage corresponding to a difference between a voltage received from the switching thin film transistor and a driving voltage (e.g., a driving power) ELVDD supplied to the driving voltage supply line PL.

The driving thin film transistor is connected to the driving voltage supply line PL and the storage capacitor, and may control a driving current flowing in the display element 200 via the driving voltage supply line PL in response to a value (e.g., a level) of the voltage stored in the storage capacitor. The display element 200 may emit light having a desired luminance according to the driving current, and the emitted light may be a red colored light, a green colored light, a blue colored light, or a white light.

The non-display area NDA is an area surrounding (e.g., around a periphery of) the display area DA and at (e.g., in or on) which the pixels P are not disposed, and thus, no image is provided from the non-display area NDA.

A driving portion (e.g., a driver or a driving circuit) 20, a power supply wiring 30, a discharge element 300, and a sealing member 500 may be located at (e.g., in or on) the non-display area NDA.

The driving portion 20 may include a light-emitting driving circuit, a scan driving circuit, and/or the like. The light-emitting driving circuit is located at (e.g., in or on) the non-display area NDA of the lower substrate 100, and generates an emission control signal. The light-emitting driving circuit transmits the generated emission control signal to each pixel P via an emission control line. The scan driving circuit is locate at (e.g., in or on) the non-display area NDA of the lower substrate 100, and generates a scan signal. The scan driving circuit transmits the generated scan signal to each pixel P via the scan line SL.

The power supply wiring 30 is located at (e.g., in or on) the non-display area NDA of the lower substrate 100, and may surround at least a part (e.g., may surround at least a portion of a periphery) of the display area DA. The power supply wiring 30 may provide the driving power ELVDD to the pixels P via the driving voltage supply line PL, or a common power ELVSS to a common electrode of the display element 200.

The discharge element 300 is located at (e.g., in or on) the non-display area NDA of the lower substrate 100. The discharge element 300 may discharge static electricity generated during manufacture and/or use of the display apparatus 1. Accordingly, the static electricity generated during manufacture and/or use of the display apparatus 1, which may cause damage to the display element 200 and/or the pixel circuit, and thus, causing defects, may be prevented or substantially prevented from being introduced into the display area DA. Accordingly, damage that may be caused by the static electricity may be prevented or reduced.

As discussed in more detail below with reference to FIGS. 3 to 9, the discharge element 300 may include an electrode layer 330, a discharge layer 310 disposed on the electrode layer 330, and a first insulating layer 321 provided between the electrode layer 330 and the discharge layer 310.

When the display apparatus 1 includes an upper substrate 400, the sealing member 500 may be provided between the lower substrate 100 and the upper substrate 400. In other words, the upper substrate 400 may be located above the lower substrate 100, and the sealing member 500 for bonding the lower substrate 100 and the upper substrate 400 to each other may be located between the lower substrate 100 and the upper substrate 400.

The upper substrate 400 may be an encapsulation substrate, cover glass, or a color filter unit substrate, but the disclosure is not limited thereto. The upper substrate 400 may have an area smaller than that of the lower substrate 100, and a pad area disposed at an edge of the lower substrate 100 may be exposed (e.g., may not be covered by the upper substrate 400).

The sealing member 500 may be disposed between the upper substrate 400 and the lower substrate 100 at (e.g., in or on) the non-display area NDA of the lower substrate 100, and may surround (e.g., around a periphery of) the display area DA. The sealing member 500 may include an inorganic material, for example, such as frit, or an epoxy. Accordingly, a spaced at the side of the display area DA, which is defined by the lower substrate 100, the upper substrate 400, and the sealing member 500, may be blocked from the outside, and thus, intrusion of external moisture and/or foreign materials into the inside of the display apparatus 1 may be prevented or substantially prevented.

The sealing member 500 may at least partially overlap with an adjacent element, and thus, a dead space of the display apparatus 1 may be reduced. For example, in some embodiments, the sealing member 500 may be disposed to cover and/or overlap with an outer end portion of the power supply wiring 30 or with the discharge element 300.

FIGS. 3-9 are examples of schematic cross-sectional views taken along the line I-I' of FIG. 2 according to one or more embodiments.

Figure 3:
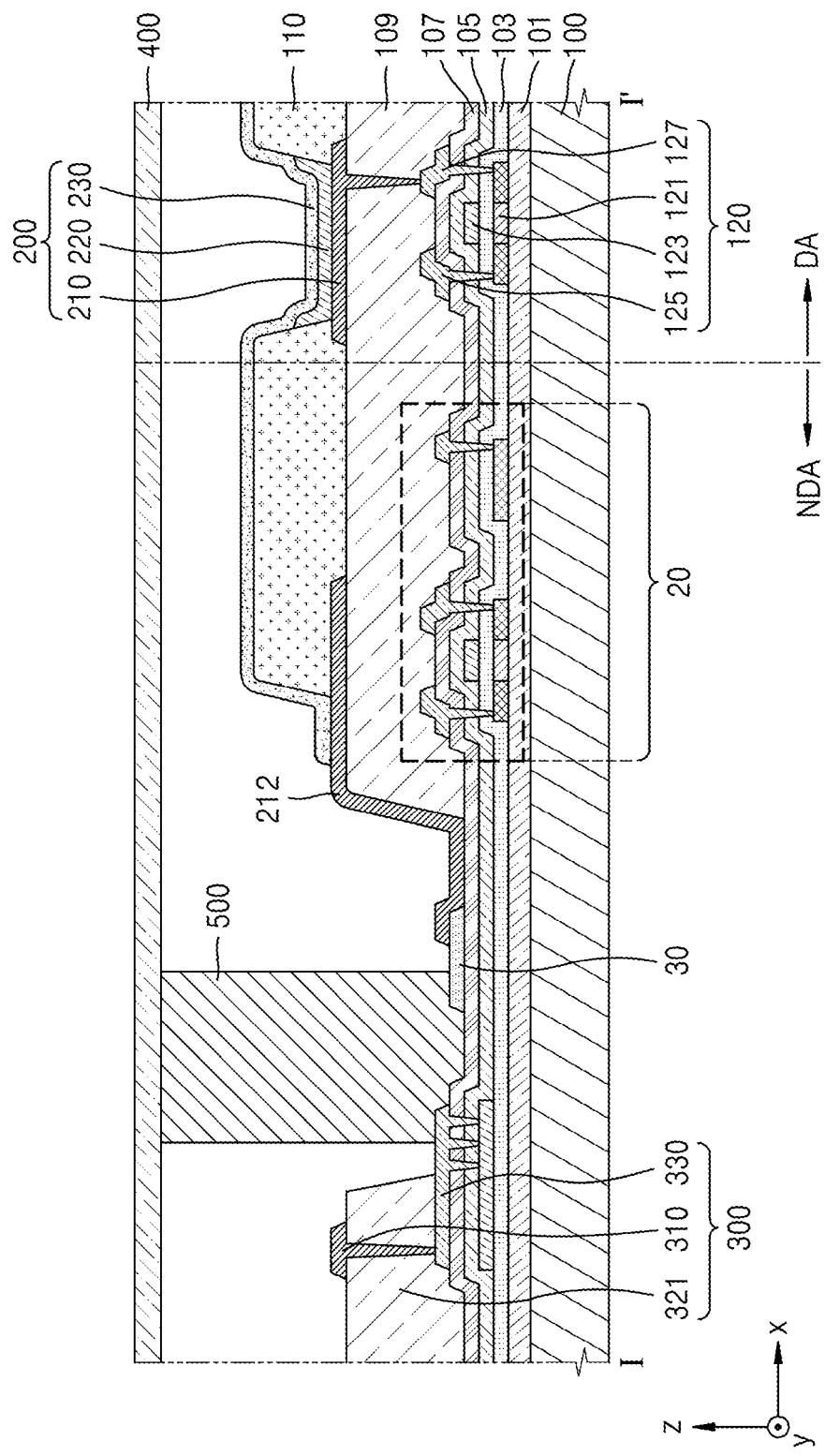
FIGS. 3-9 are examples of schematic cross-sectional views taken along the line I-I' of FIG. 2 according to one or more embodiments.

Referring to FIG. 3, the pixel circuit and the display element 200, which is electrically connected to the pixel circuit, may be located at (e.g., in or on) the display area DA on the lower substrate 100. The driving portion 20, the power supply wiring 30, the discharge element 300, and the sealing member 500 may be located at (e.g., in or on) the non-display area NDA on the lower substrate 100.

The lower substrate 100 may include various suitable materials, for example, such as a glass material, a metal material, or a plastic material, for example, such as polyethylene terephthalate (PET), polyethylene naphthalate (PEN), or polyimide. The lower substrate 100 may have various suitable structures, for example, such as a single layer structure, or a multilayered structure in which a barrier layer formed of an inorganic material such as silicon oxide is provided between two polyimide layers.

The upper substrate 400 may include a transparent material. For example, the upper substrate 400 may include a glass material or a plastic material, for example, such as polyethylene terephthalate (PET), polyethylene naphthalate (PEN), or polyimide, but the present disclosure is not limited thereto. In some embodiments, the upper substrate 400 may include a material that is the same as or different from the material of the lower substrate 100, or may include a combination of a material that is the same as and a material that is different from that of the lower substrate 100.

A buffer layer 101 may be formed on the lower substrate 100. The buffer layer 101 may include an inorganic material, for example, such as silicon oxide, silicon nitride, and/or silicon oxynitride, and may have a single layer structure or a multilayered structure. The buffer layer 101 may be located at (e.g., in or on) the display area DA, and may be formed to extend to at least a portion of the non-display area NDA. The buffer layer 101 may improve the smoothness of an upper surface of the lower substrate 100, and/or may prevent or reduce intrusion of foreign materials and/or moisture from the outside of the lower substrate 100 into a semiconductor layer 121 of a thin film transistor 120.

The pixel circuit is located at (e.g., in or on) the display area DA on the lower substrate 100, and may include the thin film transistor 120 and a conductive layer. The display element 200 may be electrically connected to the pixel circuit. For example, a pixel electrode 210 of (e.g., included in) the display element 200 may be electrically connected to the thin film transistor 120.

The thin film transistor 120 may include the semiconductor layer 121, a gate electrode 123, a source electrode 125, and a drain electrode 127. The semiconductor layer 121 may include, for example, amorphous silicon, polycrystalline silicon, or an organic semiconductor material. The gate electrode 123 may include various suitable conductive materials including molybdenum (Mo), aluminum (Al), copper (Cu), or titanium (Ti), and may have various suitable layered structures. For example, the gate electrode 123 may include a Mo layer and an Al layer, or may have a multilayered structure of Mo/Al/Mo.

The source electrode 125 and the drain electrode 127 may include various suitable conductive materials including Mo, Al, Cu, or Ti, and may have various suitable layered structures. For example, the source electrode 125 and the drain electrode 127 may include a Ti layer and an Al layer, or may have a multilayered structure of Ti/Al/Ti.

To secure insulation between the semiconductor layer 121 and the gate electrode 123, a gate insulating layer 103 including an inorganic material, for example, such as silicon oxide, silicon nitride, and/or silicon oxynitride, may be disposed between the semiconductor layer 121 and the gate electrode 123. A first interlayer insulating layer 105 as a layer with a desired or suitable dielectric constant may be located on the gate electrode 123, and the first interlayer insulating layer 105 may be an insulating layer including an inorganic material, for example, such as silicon oxide, silicon nitride, and/or silicon oxynitride. The source electrode 125 and the drain electrode 127 may be located on the first interlayer insulating layer 105. As such, an insulating layer (e.g., an insulating film) including an inorganic material may be formed by a chemical vapor deposition (CVD) method or an atomic layer deposition (ALD) method. This may be applied to one or more of the below-described embodiments and modified examples thereof in the same or substantially the same fashion.

A planarization layer 109 may be disposed on the thin film transistor 120. When an organic light-emitting diode as an example of the display element 200 is located on the thin film transistor 120, the planarization layer 109 may planarize or substantially planarize an upper surface of a protection film covering the thin film transistor 120. The planarization layer 109 may include, for example, an organic material such as acryl, benzocyclobutene (BCB) or hexamethyldisiloxane (HMDSO). Although FIGS. 3 to 9 illustrate the planarization layer 109 as a single layer, the planarization layer 109 may have a multilayered structure, and various suitable modifications thereto are possible as would be understood by a person having ordinary skill in the relevant arts.

In the display area DA of the lower substrate 100, the display element 200 may be located at (e.g., in or on) the planarization layer 109. The display element 200 may be, for example, an organic light-emitting diode including the pixel electrode 210, a counter electrode 230, and an intermediate layer 220 including an emission layer provided between the pixel electrode 210 and the counter electrode 230.

The pixel electrode 210, as illustrated in FIGS. 3 to 9, may be in contact with any one of the source electrode 125 and the drain electrode 127 through an opening formed in the planarization layer 109 to be electrically connected to the thin film transistor 120. The pixel electrode 210 may be a (semi-)light-transmitting electrode or a reflective electrode. In some embodiments, the pixel electrode 210 may include a reflective film including, for example, Ag, Mg, Al, Pt, Pd, Au, Ni, Nd, Ir, Cr, and/or a compound thereof, and a transparent or semi-transparent electrode layer formed on the reflective film. The transparent or semi-transparent electrode layer may include, for example, at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 210 may have a stacked structure, for example, such as ITO/Ag/ITO.

A pixel defining layer 110 may be disposed on (e.g., above) the planarization layer 109. The pixel defining layer 110 has an opening corresponding to each sub-pixel to define a pixel (e.g., to define a light-emitting area). In this case, the opening is formed to expose at least a part of a central portion of the pixel electrode 210. Furthermore, the pixel defining layer 110 may increase a distance between an edge of the pixel electrode 210 and the counter electrode 230 above the pixel electrode 210 to prevent or substantially prevent an arc from being generated from the edge of the pixel electrode 210. The pixel defining layer 110 may include, for example, an organic material such as polyimide or HMDSO.

The intermediate layer 220 of the display element 200 may include a low molecular material or a polymer material.

When the intermediate layer 220 includes a low molecular material, the intermediate layer 220 may have a structure in which a hole injection layer (HIL), a hole transport layer (HTL), an emission layer (EML), an electron transport layer (ETL), and an electron injection layer (EIL) are stacked in a single structure or a composite structure, and may include various suitable organic materials, for example, such as copper phthalocyanine (CuPc), N,N'-Di(naphthalene-1-yl)-N,N'-diphenyl-benzidine (NPB), and tris-8-hydroxyquinoline aluminum (Alq3). In some embodiments, the above described layers may be formed in a vacuum deposition method.

When the intermediate layer 220 includes a polymer material, the intermediate layer 220 may have a structure including an HTL and an EML. In this case, the HTL may include PEDOT, and the EML may include a poly-phenylenevinylene (PPV)-based polymer material and a polyfluorene-based polymer material. In some embodiments, the intermediate layer 220 may be formed by a screen printing method, an inkjet printing method, or a laser induced thermal imaging (LITI) method. However, the present disclosure is not limited thereto, and the intermediate layer 220 and may have various suitable structures. Furthermore, the intermediate layer 220 may include an integral layer across a plurality of pixel electrodes 210, or a layer patterned to correspond to each of the pixel electrodes 210 (e.g., to overlap with the pixel electrodes 210 when viewed in a direction perpendicular to or substantially perpendicular to the lower substrate 100).

The counter electrode 230 of the display element 200 is disposed at (e.g., in or on) the display area DA. In an example embodiment, the counter electrode 230 may include an integral layer to cover the entire surface of the display area DA, and may be disposed at (e.g., in or on) the display area DA. In other words, the counter electrode 230 may be integrally formed with respect to a plurality of display elements 200 to correspond to the pixel electrodes 210 thereof. In this case, the counter electrode 230, which covers the display area DA, may extend to a part of the non-display area NDA outside (e.g., adjacent to) the display area DA. In another example embodiment, the counter electrode 230 may include a layer patterned to correspond to each of the pixel electrodes 210 (e.g., to overlap with the pixel electrodes 210 when viewed in a direction perpendicular to or substantially perpendicular to the lower substrate 100), and may be disposed at (e.g., in or on) the display area DA.

The counter electrode 230 may be a light-transmitting electrode or a reflective electrode. In some embodiments, the counter electrode 230 may be a transparent or semi-transparent electrode, and may include a metal thin film having a relatively low work function including, for example, Li, Ca, LiF/Ca, LiF/Al, Al, Ag, Mg, and/or a compound thereof. In some embodiments, the counter electrode 230 may further include a transparent conductive oxide (TCO) film, for example, such as ITO, IZO, ZnO, or $In_2O_3$, in addition to the metal thin film.

In some embodiments, the display apparatus 1 may further include an encapsulation layer located to cover the display element 200 and to protect the display element 200. The encapsulation layer may prevent or substantially prevent the display element 200 from being damaged by external moisture and/or oxygen. The encapsulation layer may cover the display area DA, and may extend to at least a part (or a portion) of the non-display area NDA. The encapsulation layer may include a first inorganic encapsulation layer, an organic encapsulation layer, and a second inorganic encapsulation layer.

The data line DL (e.g., see FIG. 2) may be disposed at (e.g., in or on) the same layer as that of the source electrode 125 and the drain electrode 127 of the thin film transistor 120. Accordingly, the data line DL may include the same material as that of the source electrode 125 and the drain electrode 127, and the data line DL may have the same or substantially the same layered structure as the layered structure of the source electrode 125 and the drain electrode 127. The pixel electrode 210 may be disposed on the planarization layer 109, which is an insulating layer covering the source electrode 125, the drain electrode 127, and also the data line DL, and connection wirings may be partially disposed on the planarization layer 109.

The driving portion 20, the power supply wiring 30, the discharge element 300, and the sealing member 500 may be located at (e.g., in or on) the non-display area NDA on the lower substrate 100.

The driving portion 20 may include one or more thin film transistors, and a wiring connected to the thin film transistors included in the driving portion 20. The thin film transistor included in the driving portion 20 may be formed in the same or substantially the same process in which the thin film transistor 120 of the pixel circuit is formed.

The power supply wiring 30 may include the same material as that of the driving voltage supply line PL. For example, the power supply wiring 30 may have a multilayered structure of Ti/Al/Ti. An outer end (e.g., an outer edge) portion of the power supply wiring 30 may be covered by the sealing member 500, and an inner end (e.g., an inner edge) portion thereof, which is opposite to the outer end portion, may be covered by a conductive film 212. When the inner end portion of the power supply wiring 30 is covered by the conductive film 212, one side of the conductive film 212 may be connected to the power supply wiring 30, and the other side thereof may be connected to the counter electrode 230, thereby supplying power. However, the present disclosure is not limited thereto, and in other embodiments, the power supply wiring 30 may extend toward the display area DA to be directly connected to the counter electrode 230. The conductive film 212 may include the same material as that of the pixel electrode 210. For example, the conductive film 212 may have a stacked structure of ITO/Ag/ITO.

The discharge element 300 may include the discharge layer 310, the first insulating layer 321, and the electrode layer 330.

The discharge layer 310 of the discharge element 300 may be located at the top of the discharge element 300, and may allow static electricity generated during manufacture and/or use of the display apparatus 1 to be concentrated on the discharge element 300. In other words, the discharge layer 310 is located ahead on a movement path of static electricity to absorb the static electricity in advance, and thus, static electricity generated inside or outside the display apparatus 1 may not reach other elements provided at (e.g., in or on) the display area DA. In this case, the discharge layer 310 may include a conductive layer including a conductive material to pass electricity.

In an example embodiment, the discharge layer 310 may include the same material as that of the pixel electrode 210, and may have the same or substantially the same layered structure as that of the pixel electrode 210. In this case, the discharge layer 310 may be concurrently (e.g., simultaneously) formed in a forming process of the pixel electrode 210. For example, the discharge layer 310 and the pixel electrode 210 may each have a stacked structure of ITO/Ag/ITO. However, the present disclosure is not limited to the above example embodiment.

To increase a static electricity absorption effect, the discharge layer 310 may be formed such that a height at which the discharge layer 310 is located, or a width of the discharge layer 310, satisfies suitable conditions (e.g., preset conditions).

For example, in an embodiment, the discharge layer 310 may be formed such that a distance from the upper surface of the lower substrate 100 to an upper surface of the discharge layer 310 is greater than or equal to a distance from the upper surface of the lower substrate 100 to an upper surface of a top conductive layer included in the pixel circuit located at (e.g., in or on) the display area DA or the non-display area NDA on the lower substrate 100, for example, a top layer of the thin film transistor 120. In other words, the discharge layer 310 may be formed such that a height of the upper surface of the discharge layer 310 from the upper surface of the lower substrate 100 is greater than or equal to a height of an upper surface of the top conductive layer (e.g., the top layer of the thin film transistor 120) included in the pixel circuit from the lower substrate 100. Thus, the discharge layer 310 may serve as a kind of lightning rod, such that the static electricity is further concentrated on the discharge layer 310, instead of on the top conductive layer included in the pixel circuit, and thus, a static electricity discharge effect by the discharge element 300 may be improved (e.g., may be remarkably improved).

Figure 4:
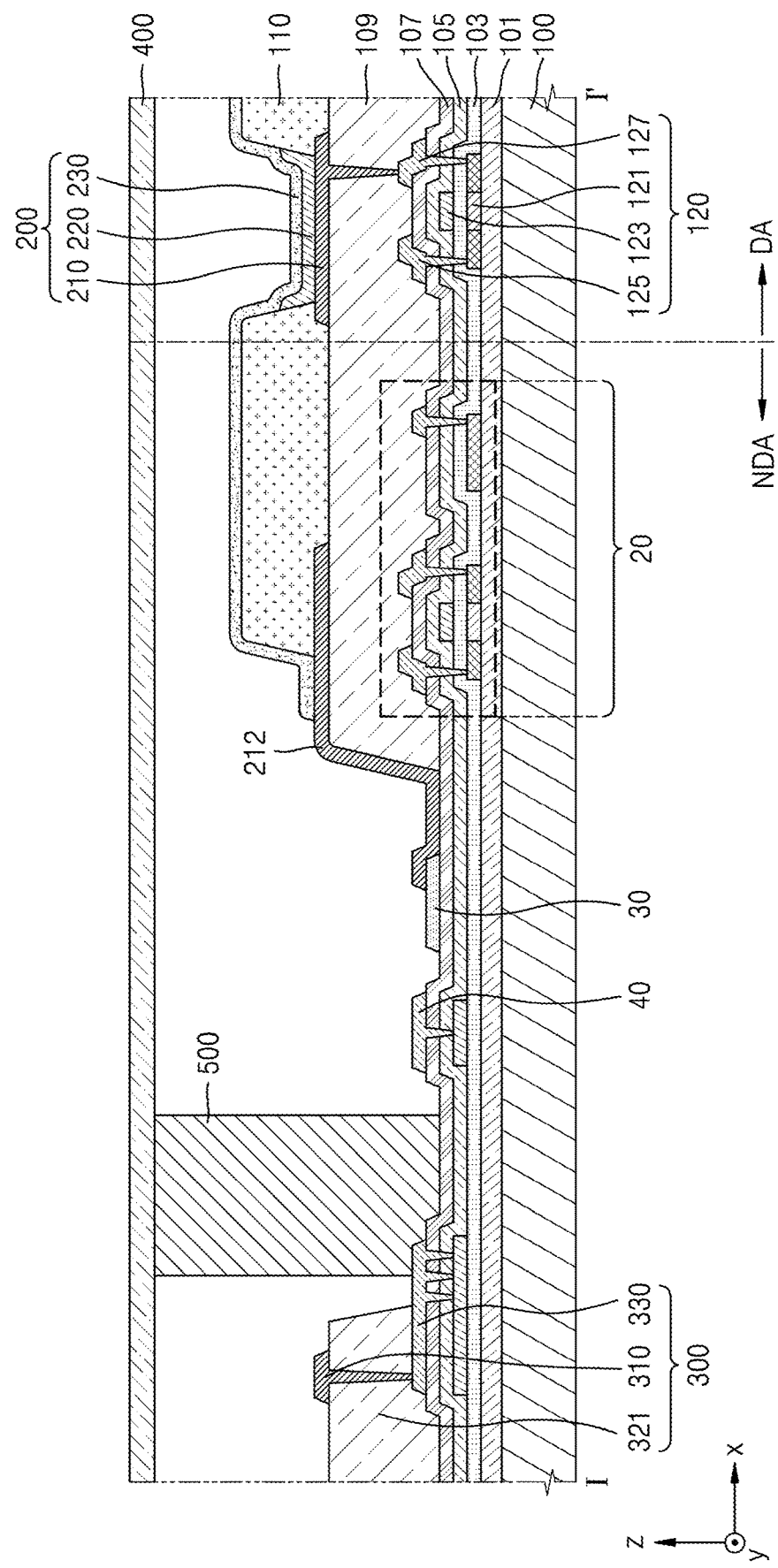

As illustrated in FIG. 4, in some embodiments, various protruding conductive layers 40 may be located at (e.g., in or on) the same layer as that of the conductive layer included in the pixel circuit, for example, the thin film transistor 120, and/or the like, disposed at (e.g., in or on) the display area DA or the non-display area NDA on the lower substrate 100 of the display apparatus 1. In this case, the protruding conductive layers 40 may absorb the static electricity generated during the manufacture and/or use of the display apparatus 1, and may providing a path through which the static electricity reaches the display area DA. According to one or more example embodiments, because the discharge layer 310 may be located at a height greater than or equal to an upper surface of the top layer of the thin film transistor 120 with respect to the upper surface of the lower substrate 100, the static electricity may be prevented or substantially prevented from being introduced into the protruding conductive layers 40, and thus, the static electricity may be concentrated on the discharge layer 310.

In another embodiment, a distance from the upper surface of the lower substrate 100 to the upper surface of the discharge layer 310 may be greater than a distance from the upper surface of the lower substrate 100 to an upper surface of the pixel electrode 210 or an upper surface of the conductive film 212. In other words, a height at which the upper surface of the discharge layer 310 is located with respect to the upper surface of the lower substrate 100 may be greater than a height at which the upper surface of the pixel electrode 210 or the upper surface of the conductive film 212 is located with respect to the upper surface of the lower substrate 100.

Figure 5:
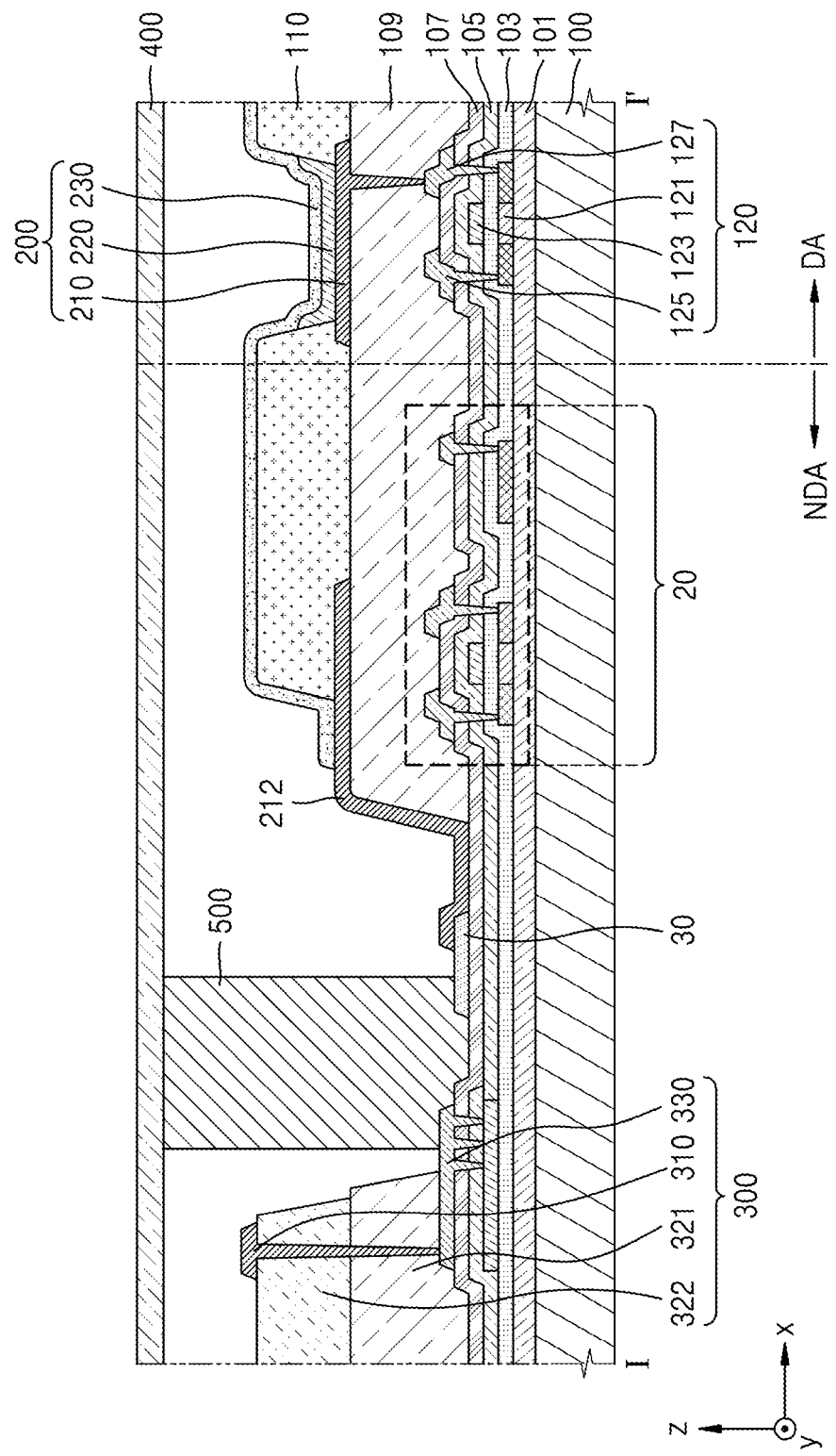

For example, as illustrated in FIG. 5, in some embodiments, the discharge element 300 may further include a second insulating layer 322 provided between the first insulating layer 321 and the discharge layer 310. Accordingly, the discharge layer 310 may be located higher than the pixel electrode 210 or the conductive film 212 from the upper surface of the lower substrate 100 by the height of the second insulating layer 322, and thus, may absorb static electricity earlier than the pixel electrode 210 or the conductive film 212. In this case, the second insulating layer 322 may be a layer including a material that is the same as or different from the material of the first insulating layer 321.

In another embodiment, when a direction from the edge of the lower substrate 100 to the center of the lower substrate 100 is a first direction, the width in the first direction of the upper surface of the discharge layer 310 may be less than or equal to the width in the first direction of the upper surface of the pixel electrode 210, the upper surface of the conductive film 212, or the upper surface of the top conductive layer of the pixel circuit. In other words, the discharge layer 310 may have a width that is less than the width of an element into which static electricity may be introduced, for example, such as the pixel electrode 210, the conductive film 212, or the top conductive layer of the pixel circuit, with respect to a movement direction of the static electricity in a static electricity movement path. Accordingly, considering that static electricity may primarily flow to a place with a higher surface charge density, and that the surface charge density is inversely proportional to the radius, the static electricity may be further concentrated on the discharge layer 310.

The first insulating layer 321 of the discharge element 300 is provided between the electrode layer 330 and the discharge layer 310. The first insulating layer 321 allows the discharge layer 310 to be located higher with respect to the upper surface of the lower substrate 100 than the top conductive layer included in the pixel circuit, for example, the top layer of the thin film transistor 120, and/or the like located at (e.g., in or on) the display area DA or the non-display area NDA on the lower substrate 100.

In an embodiment, the first insulating layer 321 may include the same material as that of a layer located below the pixel electrode 210 and in contact with the pixel electrode 210, and may have the same layered structure as a layered structure of the layer located below the pixel electrode 210 and in contact with the pixel electrode 210. In this case, the first insulating layer 321 may be concurrently (e.g., simultaneously) formed in a forming process of the layer located below the pixel electrode 210 and in contact with the pixel electrode 210. For example, when the planarization layer 109 is the layer located below the pixel electrode 210 and in contact with the pixel electrode 210, the first insulating layer 321 may include the same material as that of the planarization layer 109, and may have the same layered structure as the layered structure of the planarization layer 109, such that the first insulating layer 321 and the planarization layer 109 may be concurrently (e.g., simultaneously) formed with each other.

The electrode layer 330 of the discharge element 300 is electrically connected to a gate electrode located below the electrode layer 330, and transmits the static electricity introduced from the discharge layer 310 above the electrode layer 330 to the gate electrode below the electrode layer 330. For example, a contact hole may be formed in a layer provided between the electrode layer 330 and the gate electrode below the electrode layer 330 to allow the electrode layer 330 and the gate electrode below the electrode layer 330 to be in contact with each other.

In an embodiment, the electrode layer 330 may include the same material as that of the source electrode 125 and the drain electrode 127, and may be located at the same layer as that of the source electrode 125 and the drain electrode 127. For example, the electrode layer 330, the source electrode 125, and the drain electrode 127 may include a Ti layer and an Al layer, or may have a multilayered structure of Ti/Al/Ti. In this case, the electrode layer 330 may be concurrently (e.g., simultaneously) formed in a forming process of the source electrode 125 and the drain electrode 127.

The gate electrode below the electrode layer 330 may be electrically connected to a ground electrode to discharge or exhaust the received static electricity. Furthermore, the gate electrode below the electrode layer 330 may include the same material as that of the gate electrode 123, and may be located at (e.g., in or on) the same layer as that of the gate electrode 123 located below the display element 200 at (e.g., in or on) the display area DA of the lower substrate 100. In this case, the gate electrode below the electrode layer 330 may be concurrently (e.g., simultaneously) formed in a forming process of the gate electrode 123 below the display element 200. Accordingly, the gate electrode below the electrode layer 330 may include various suitable conductive materials, for example, including Mo, Al, Cu, or Ti, and may have various suitable layered structures. For example, the gate electrode below the electrode layer 330 may include a Mo layer and an Al layer, or may have a multilayered structure of Mo/Al/Mo.

In some embodiments, as illustrated in FIG. 2, the electrode layer 330 (e.g., shown as the discharge element 300 in FIG. 2) may be located by extending along at least a part of the edge of the display area DA on the lower substrate 100. In this case, the discharge layer 310 of the discharge element 300 may include a first discharge layer and a second discharge layer arranged to be spaced apart from each other in a direction in which the electrode layer 330 extends, or may include a plurality of isolated-shape conductive layers. In other words, the discharge layers 310 or the conductive layers included in the discharge layers 310 may be located to be spaced apart from each other in the direction in which the electrode layer 330 extends.

The sealing member 500 is provided between the lower substrate 100 and the upper substrate 400 to bond or to attach the lower substrate 100 and the upper substrate 400 to each other. The sealing member 500 may include a frit or an epoxy. The frit may be a paste including a laser or infrared absorber, an organic binder, a filler to reduce a thermal expansion coefficient, and/or the like, which may be included in a main material of $SiO_2$. A frit paste may be removed of the organic binder and moisture through a drying and sintering process, and then cured. The laser or infrared absorber may include a transition metal compound. The frit may be cured by laser, and/or the like to form the sealing member 500.

Example embodiments in which the display apparatus 1 includes a plurality of discharge layers 310 are described below with reference to FIGS. 6 to 9.

In some embodiments, the display apparatus 1 may include a plurality of discharge layers 310. While FIGS. 6 to 9 illustrate two discharge layers 310 for convenience of illustration, the present disclosure is not limited thereto, and the plurality of discharge layers 310 may include any suitable number of discharge layers 310.

Figure 6:
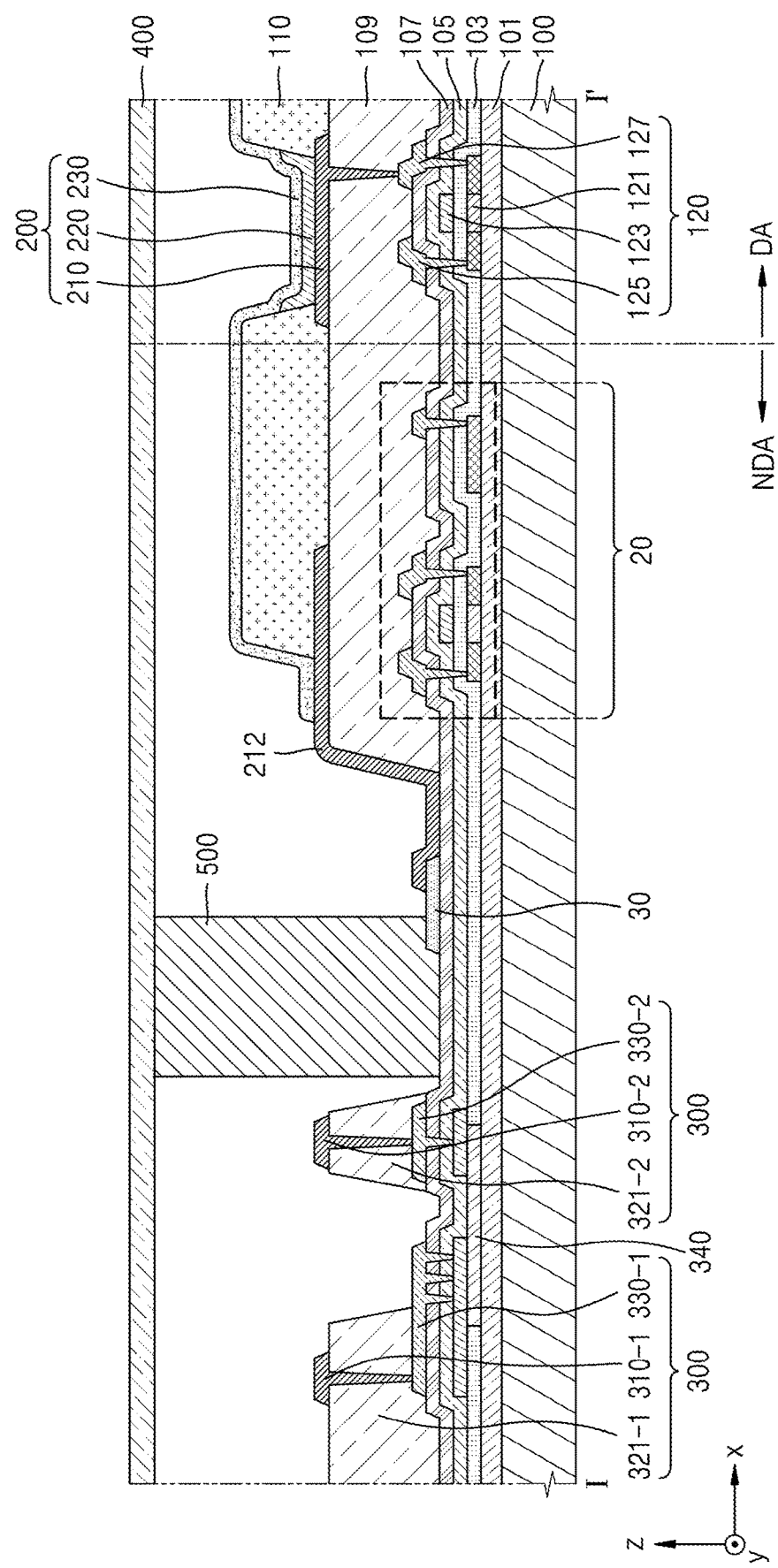

Referring to FIG. 6, in some embodiments, the discharge element 300 may include a first electrode layer 330-1, a first discharge layer 310-1 above the first electrode layer 330-1, a (1-1)st insulating layer 321-1 between the first electrode layer 330-1 and the first discharge layer 310-1, a second electrode layer 330-2, a second discharge layer 310-2 above the second electrode layer 330-2, and a (1-2)nd insulating layer 321-2 between the second electrode layer 330-2 and the second discharge layer 310-2. In more detail, the first discharge layer 310-1 may be located above the (1-1)st insulating layer 321-1, and may be in contact with the first electrode layer 330-1 via a contact hole formed in the (1-1)st insulating layer 321-1. The second discharge layer 310-2 may be located above the (1-2)nd insulating layer 321-2, and may be in contact with the second electrode layer 330-2 via a contact hole formed in the (1-2)nd insulating layer 321-2. Accordingly, static electricity absorbed by the first discharge layer 310-1 may be transmitted to the first electrode layer 330-1, and static electricity absorbed by the second discharge layer 310-2 may be transmitted to the second electrode layer 330-2.

In this case, each of the first discharge layer 310-1 and the second discharge layer 310-2 may function to absorb the static electricity. For example, when the first discharge layer 310-1 is located closer to the edge of the lower substrate 100 than the second discharge layer 310-2, externally generated static electricity may first pass an area where the first discharge layer 310-1 is located. In this case, even when the static electricity is not absorbed by the first discharge layer 310-1 and passes an area where the first discharge layer 310-1 is located, the static electricity may be absorbed by the second discharge layer 310-2, and thus, the static electricity may be effectively prevented from reaching the display area DA.

In some embodiments, a (2-1)st insulating layer may be further provided between the first discharge layer 310-1 and the (1-1)st insulating layer 321-1, and/or a (2-2)nd insulating layer may be further provided between the second discharge layer 310-2 and the (1-2)nd insulating layer 321-2. In other words, when the discharge layers 310 are formed, as the (2-1)st and/or (2-2)nd insulating layers are provided between some of the discharge layers 310 or all of the discharge layers 310 and the (1-1)st and/or (1-2)nd insulating layers disposed thereunder, the discharge layers 310 may be formed to have a greater height with respect to the upper surface of the lower substrate 100 than an embodiment without the (2-1)st and (2-2)nd insulating layers.

In an embodiment, the discharge element 300 may further include a metal layer 340 located above the lower substrate 100, and electrically connecting the first electrode layer 330-1 and the second electrode layer 330-2 to each other. An upper surface of the metal layer 340 may be in contact with a lower surface of the gate electrode below the first electrode layer 330-1 and a lower surface of the gate electrode below the second electrode layer 330-2. Accordingly, the static electricity absorbed by the first discharge layer 310-1 or the second discharge layer 310-2 may be received (e.g., may be gathered or collected) in the metal layer 340 to be discharged or exhausted therefrom. For example, the metal layer 340 may be electrically connected to the ground electrode to discharge or exhaust the received static electricity.

In another embodiment, referring to FIG. 7, the first electrode layer 330-1 and the second electrode layer 330-2 may be integrally formed, and the gate electrode below the first electrode layer 330-1 and the gate electrode below the second electrode layer 330-2 may be integrally formed. In other words, the first discharge layer 310-1 and the second discharge layer 310-2 may be in contact with the electrode layer 330. The first discharge layer 310-1 may be in contact with the electrode layer 330 via the contact hole formed in the (1-1)st insulating layer 321-1, and the second discharge layer 310-2 may be in contact with the electrode layer 330 via the contact hole formed in the (1-2)nd insulating layer 321-2. In this case, the static electricity absorbed by each of the first discharge layer 310-1 and the second discharge layer 310-2 is transmitted to the electrode layer 330 that is integrally formed, and thus, without separately having the metal layer 340, the static electricity absorbed by each of the first discharge layer 310-1 and the second discharge layer 310-2 may be gathered to be discharged or exhausted therefrom.

Figure 8:
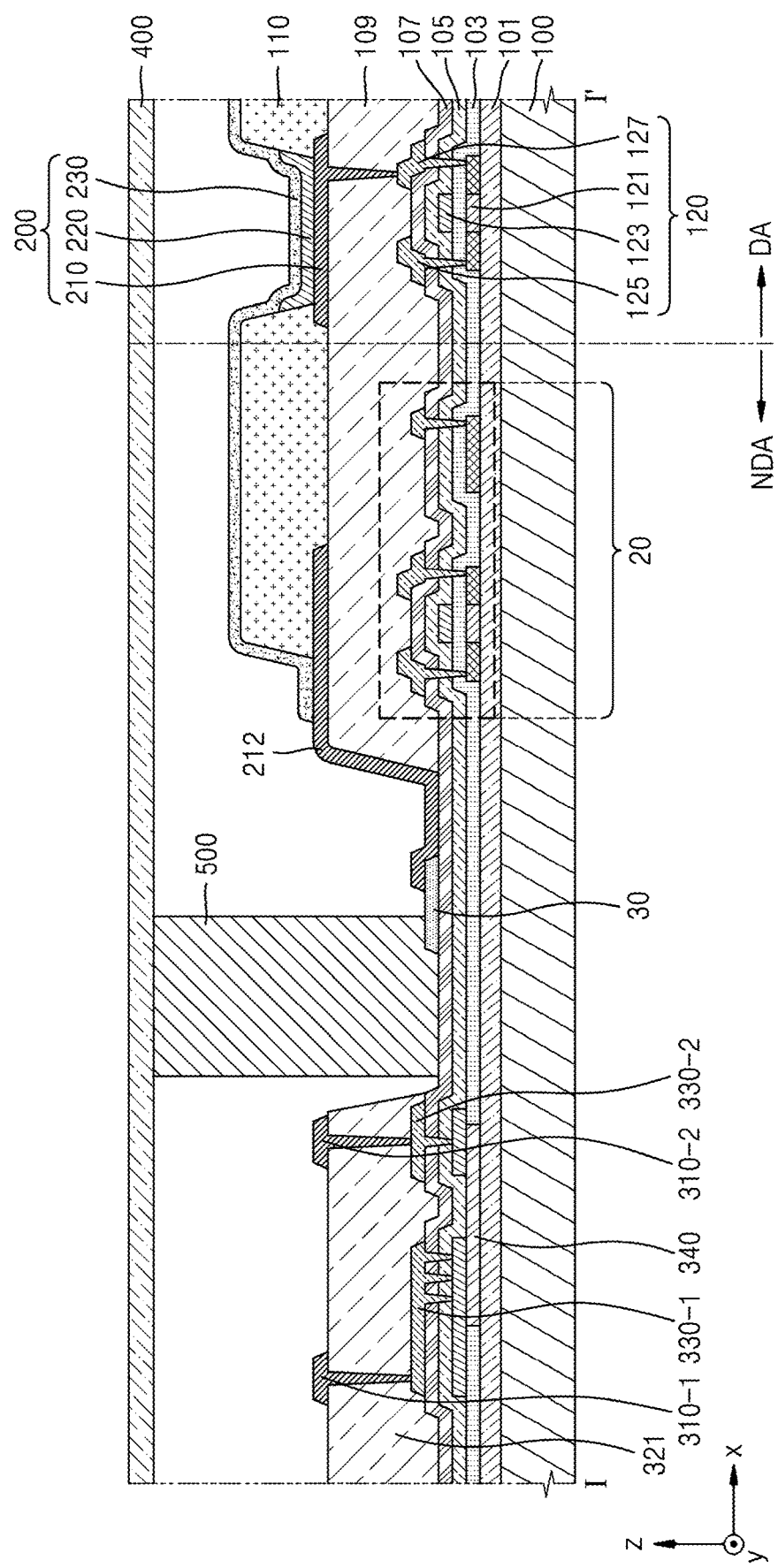

In another embodiment, Referring to FIG. 8, the (1-1)st insulating layer 321-1 and the (1-2)nd insulating layer 321-2 may be integrally formed. In this case, the first insulating layer 321 that is integrally formed may include a contact hole that allows the first discharge layer 310-1 to be in contact with the first electrode layer 330-1, and a contact hole that allows the second discharge layer 310-2 to be in contact with the second electrode layer 330-2. The contact holes may be formed to correspond to the first discharge layer 310-1 and the second discharge layer 310-2, respectively. In other words, the first discharge layer 310-1 and the second discharge layer 310-2 may be in contact with the first electrode layer 330-1 and the second electrode layer 330-2, respectively, via the contact holes formed in the first insulating layer 321 that is integrally formed.

Figure 7:
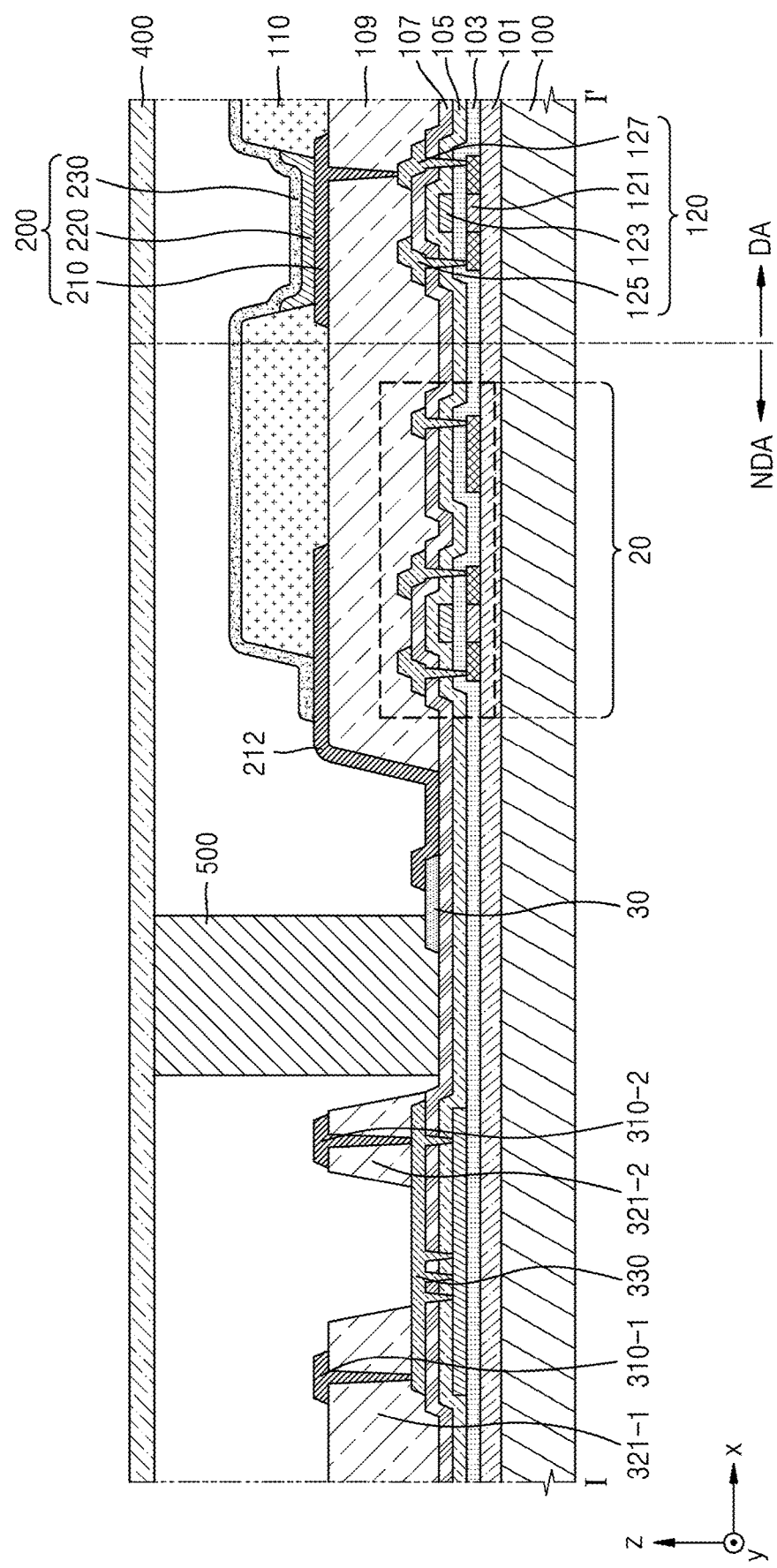

In some embodiments, the (1-1)st insulating layer 321-1 and the (1-2)nd insulating layer 321-2 may be integrally formed like the first insulating layer 321 of FIG. 8, and the first electrode layer 330-1 and the second electrode layer 330-2 may be integrally formed like the electrode layer 330 of FIG. 7. In this case, the first discharge layer 310-1 and the second discharge layer 310-2 may be in contact with the electrode layer 330 that is integrally formed through the contact holes formed in the first insulating layer 321 that is integrally formed.

Figure 9:
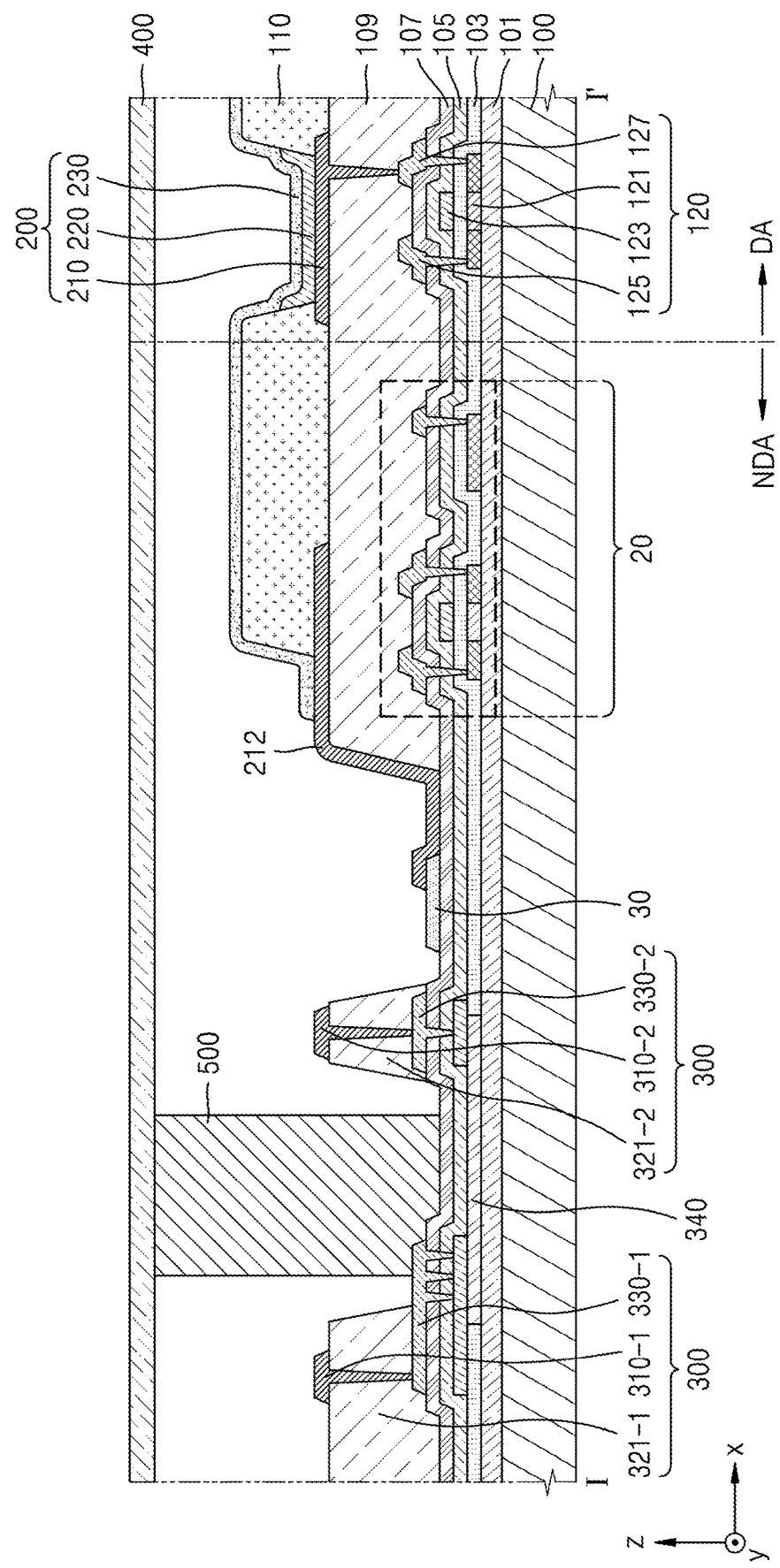

In another embodiment, referring to FIG. 9, the first discharge layer 310-1 may be located outside the sealing member 500 (e.g., toward the edge of the lower substrate 100), and the second discharge layer 310-2 may be located inside the sealing member 500 (e.g., toward the display area DA). In other words, when the discharge element 300 includes the discharge layers 310, some of the discharge layers 310 may be located outside the sealing member 500, and the others of the discharge layers 310 may be located inside the sealing member 500. Accordingly, the first discharge layer 310-1 located outside the sealing member 500 may primarily absorb static electricity outside the sealing member 500, and the second discharge layer 310-2 may absorb remaining static electricity that is not absorbed by the first discharge layer 310-1, passes through the sealing member 500, and introduced into the sealing member 500.

A pattern of the discharge layers 310 disposed inside or outside the sealing member 500 may be variously modified as necessary or desired. In an example embodiment, the discharge layers 310 may be located inside or outside the sealing member 500 to be alternately arranged in a zigzag pattern on a plan view. In other words, while some of the discharge layers 310 may be located outside the sealing member 500 to be spaced apart from each other at desired intervals (e.g., predetermined intervals), others of the discharge layers 310 may be located inside the sealing member 500 to be spaced apart from each other at desired intervals (e.g., predetermined intervals) corresponding to a space between the discharge layers 310 located outside the sealing member 500. Accordingly, absorption by the discharge layers 310 located inside the sealing member 500 of the remaining static electricity that passes through the space between the discharge layers 310 located outside the sealing member 500 may be increased.

When some of the discharge layers 310 are located outside the sealing member 500 and others of the discharge layers 310 are located inside the sealing member 500, the above-described configuration of the metal layer 340 (e.g., with reference to FIG. 8) may be applied in the same or substantially the same fashion. For example, as illustrated in FIG. 9, the metal layer 340 may pass through an area where the sealing member 500 is located, for example, underneath the sealing member 500. In this case, the upper surface of the metal layer 340 may be in contact with the lower surface of the gate electrode below the first electrode layer 330-1 and the lower surface of the gate electrode below the second electrode layer 330-2.

Furthermore, in some embodiments, the above-described configuration of the second insulating layer 322 (e.g., with reference to FIG. 5) may be applied to any of the embodiments described with reference to FIGS. 6 through 9, for example, such that the second insulating layer 322 may be further provided below some of or all of the discharge layers 310.

Although various structures of the display apparatus 1 is mainly described above, the present disclosure is not limited thereto. For example, the various structures of the display apparatus 1 described in the present disclosure may be applied to a method of manufacturing the display apparatus 1.

According to one or more of the above-described embodiments, various display apparatuses having an electrostatic discharge function may be implemented. However, the present disclosure is not limited to such functions, aspects, and features.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described.

Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display apparatus comprising:
   a lower substrate comprising a display area and a non-display area;
   a thin film transistor on the lower substrate in a first direction at the display area;
   a display element at the display area and electrically connected to the thin film transistor;
   a discharge element at the non-display area; and
   a driving circuit configured to generate at least one of a scan signal or an emission control signal, the driving circuit being located at the non-display area between the discharge element and the thin film transistor, and spaced from the discharge element in a plan view,
   wherein the discharge element comprises at least one electrode layer, at least one discharge layer on the at least one electrode layer and spaced entirely apart from the display element and the driving circuit in a plan view, and at least one first insulating layer on and overlapping with the at least one electrode layer in the first direction between the at least one electrode layer and the at least one discharge layer, and
   wherein a distance from an upper surface of the lower substrate to an upper surface of the at least one discharge layer is greater than or equal to a distance from the upper surface of the lower substrate to an upper surface of a top layer of the thin film transistor.

2. The display apparatus of claim 1, wherein the display element comprises a pixel electrode, a counter electrode, and an intermediate layer between the pixel electrode and the counter electrode, the intermediate layer comprising an emission layer.

3. The display apparatus of claim 2, wherein the at least one discharge layer comprises a same material as that of the pixel electrode.

4. The display apparatus of claim 3, wherein the at least one discharge layer has a same layered structure as that of the pixel electrode.

5. The display apparatus of claim 4, wherein a direction from an edge of the lower substrate to a center of the lower substrate is a second direction crossing the first direction, and a width in the second direction of the upper surface of the at least one discharge layer is less than or equal to a width in the second direction of an upper surface of the pixel electrode.

6. The display apparatus of claim 2, wherein the at least one first insulating layer comprises a same material as that of a layer below the pixel electrode in contact with the pixel electrode.

7. The display apparatus of claim 6, wherein the at least one first insulating layer has a same layered structure as that of the layer below the pixel electrode in contact with the pixel electrode.

8. The display apparatus of claim 7, wherein the discharge element further comprises a second insulating layer between the at least one first insulating layer and the at least one discharge layer.

9. The display apparatus of claim 1, wherein the discharge element comprises:
   a first electrode layer, a first discharge layer above the first electrode layer, and a first-first insulating layer between the first electrode layer and the first discharge layer; and
   a second electrode layer, a second discharge layer above the second electrode layer, and a first-second insulating layer between the second electrode layer and the second discharge layer.

10. The display apparatus of claim 9, wherein the first electrode layer and the second electrode layer are integrally formed.

11. The display apparatus of claim 9, wherein the first-first insulating layer and the first-second insulating layer are integrally formed.

12. The display apparatus of claim 9, further comprising:
   an upper substrate; and
   a sealing member at the non-display area of the lower substrate, and between the upper substrate and the lower substrate, the sealing member surrounding the display area,
   wherein the first discharge layer is located outside a periphery of the sealing member, and the second discharge layer is located within an internal boundary defined by the sealing member.

13. The display apparatus of claim 1, wherein the at least one electrode layer extends along at least part of an edge defining a periphery of the display area.

14. The display apparatus of claim 13, wherein the at least one discharge layer comprises a first discharge layer and a second discharge layer spaced from each other in a direction in which the at least one electrode layer extends.

15. The display apparatus of claim 13, wherein the at least one discharge layer comprises a plurality of isolated-shape conductive layers spaced from each other in a direction in which the at least one electrode layer extends.

16. A display apparatus comprising:
   a lower substrate comprising a display area and a non-display area;
   a thin film transistor on the lower substrate in a first direction at the display area;
   a display element at the display area and electrically connected to the thin film transistor;
   a discharge element at the non-display area; and
   a driving circuit between the discharge element and the thin film transistor and spaced from the discharge element in a plan view,
   wherein the discharge element comprises at least one electrode layer, at least one discharge layer on the at least one electrode layer, and at least one first insulating layer on and overlapping with the at least one electrode layer in the first direction between the at least one electrode layer and the at least one discharge layer,
   wherein a distance from an upper surface of the lower substrate to an upper surface of the at least one discharge layer is greater than or equal to a distance from the upper surface of the lower substrate to an upper surface of a top layer of the thin film transistor,
   wherein the at least one electrode layer comprises a first electrode layer and a second electrode layer, the at least one discharge layer comprises a first discharge layer above the first electrode layer and a second discharge layer above the second electrode layer, and the at least one first insulating layer comprises a first-first insulating layer between the first electrode layer and the first discharge layer and a first-second insulating layer between the second electrode layer and the second discharge layer, and wherein the display apparatus further comprises a metal layer on the lower substrate, and electrically connecting the first electrode layer and the second electrode layer to each other.

17. A display apparatus comprising:
a lower substrate comprising a display area and a non-display area;
a pixel circuit on the lower substrate in a first direction at the display area or the non-display area, and comprising a top conductive layer;
a display element at the display area and electrically connected to the pixel circuit;
a discharge element at the non-display area; and
a driving circuit configured to generate at least one of a scan signal or an emission control signal for the pixel circuit, the driving circuit being located at the non-display area between the discharge element and the pixel circuit, and spaced from the discharge element in a plan view,
wherein the discharge element comprises at least one electrode layer, at least one discharge layer above the at least one electrode layer and spaced entirely apart from the display element and the driving circuit in a plan view, and at least one first insulating layer on and overlapping with the at least one electrode layer in the first direction between the at least one electrode layer and the at least one discharge layer, and
wherein a distance from an upper surface of the lower substrate to an upper surface of the at least one discharge layer is greater than or equal to a distance from the upper surface of the lower substrate to an upper surface of the top conductive layer of the pixel circuit.

18. The display apparatus of claim 17, wherein a direction from an edge of the lower substrate to a center of the lower substrate is a second direction crossing the first direction, and a width in the second direction of the upper surface of the at least one discharge layer is less than or equal to a width in the second direction of the upper surface of the top conductive layer of the pixel circuit.

19. The display apparatus of claim 17, wherein the discharge element comprises:
a first electrode layer, a first discharge layer above the first electrode layer, and a first-first insulating layer between the first electrode layer and the first discharge layer; and
a second electrode layer, a second discharge layer above the second electrode layer, and a first-second insulating layer between the second electrode layer and the second discharge layer.

20. The display apparatus of claim 19, further comprising a metal layer on the lower substrate and electrically connecting the first electrode layer and the second electrode layer to each other.

* * * * *